United States Patent
Stewart et al.

(10) Patent No.: US 10,370,243 B2
(45) Date of Patent: Aug. 6, 2019

(54) PRESSURE SENSOR HAVING A BOSSED DIAPHRAGM

(71) Applicant: Honeywell International Inc., Morris Plains, NJ (US)

(72) Inventors: Carl Stewart, Plano, TX (US); Richard Davis, Plano, TX (US); Gilberto Morales, Arlington, TX (US)

(73) Assignee: Honeywell International Inc., Morris Plains, NJ (US)

( * ) Notice: Subject to any disclaimer, the term of this patent is extended or adjusted under 35 U.S.C. 154(b) by 303 days.

(21) Appl. No.: 15/049,314

(22) Filed: Feb. 22, 2016

(65) Prior Publication Data

US 2016/0257561 A1 Sep. 8, 2016

Related U.S. Application Data

(62) Division of application No. 14/543,074, filed on Nov. 17, 2014, now Pat. No. 9,267,857.

(60) Provisional application No. 61/924,347, filed on Jan. 7, 2014.

(51) Int. Cl.
*B81C 1/00* (2006.01)
*G01L 9/00* (2006.01)
*B81B 3/00* (2006.01)
*G01L 7/08* (2006.01)

(52) U.S. Cl.
CPC .......... *B81C 1/00158* (2013.01); *B81B 3/007* (2013.01); *B81B 3/0021* (2013.01); *G01L 7/08* (2013.01); *G01L 9/0042* (2013.01); *G01L 9/0044* (2013.01); *G01L 9/0047* (2013.01); *G01L 9/0054* (2013.01); *G01L 9/0055* (2013.01); *B81B 2201/0264* (2013.01); *B81B 2203/0127* (2013.01); *B81C 2201/014* (2013.01); *B81C 2201/0198* (2013.01); *B81C 2203/0728* (2013.01)

(58) Field of Classification Search
CPC ................................................. B81C 1/00158
See application file for complete search history.

(56) References Cited

U.S. PATENT DOCUMENTS

| 6,528,340 | B2 | 3/2003 | Haji-Sheikh et al. |
| 6,796,193 | B2 | 9/2004 | Haji-Sheikh et al. |
| 7,493,823 | B2 | 2/2009 | Stewart et al. |
| 9,267,857 | B2 * | 2/2016 | Stewart ............... B81C 1/00158 |
| 2003/0190765 | A1 * | 10/2003 | Haji-Sheikh .......... G01L 9/0042 438/53 |
| 2008/0178680 | A1 * | 7/2008 | Jakobsen ............... B01D 65/10 73/721 |
| 2012/0125114 | A1 | 5/2012 | Stewart et al. |

* cited by examiner

*Primary Examiner* — Seahvosh Nikmanesh
(74) *Attorney, Agent, or Firm* — Seager, Tufte & Wickhem LLP (57) ABSTRACT

A method includes forming a mask that defines a masked area and an unmasked area on a front side of a substrate, and implanting a buried layer corresponding to the unmasked area on the front side of the substrate. The method also includes forming an epitaxial layer having a back side on the front side of the substrate and on a front side of the buried layer, and creating an opening into a back side of the substrate up to a back side of the epitaxial layer and a back side of the one or portions of the buried layer.

19 Claims, 8 Drawing Sheets

| Mechanical Dimension Analysis for "H2O Sensor" | 1550 Bossed Diaphragm | | 1550 Die Size 2000um Bossed | | 140mils Die Size 2000um Bossed | |
|---|---|---|---|---|---|---|
| | mils | microns | mils | microns | mils | microns |
| Starting substrate | 17.13 | 435.0 | 17.13 | 435.0 | 17.13 | 435.0 |
| Grow epi | 0.24 | 6.0 | 0.24 | 6.0 | 0.24 | 6.0 |
| Total Wafer Thickness | 17.36 | 441.0 | 17.36 | 441.0 | 17.36 | 441.0 |
| Grind backside | 0.00 | 0.0 | 0.00 | 0.0 | 0.00 | 0.0 |
| Total Wafer Thickness | 17.36 | 441.0 | 17.36 | 441.0 | 17.36 | 441.0 |
| Polish backside | 0.00 | 0.0 | 0.00 | 0.0 | 0.00 | 0.0 |
| Final Wafer Thickness | 17.36 | 441.0 | 17.36 | 441.0 | 17.36 | 441.0 |
| Buried Layer | 0.00 | 0.0 | 0.00 | 0.0 | 0.00 | 0.0 |
| Out Diffusion | 0.16 | 4.0 | 0.16 | 4.0 | 0.16 | 4.0 |
| Final Diaphragm Thickness | 0.28 | 7.0 | 0.28 | 7.0 | 0.28 | 7.0 |
| Substrate Etched (Waf-Diaph Thk) | 17.09 | 434.0 | 17.09 | 434.0 | 17.09 | 434.0 |
| Diaphragm Pattern Alignment Error | | | | | | |
| Backside mask opening | 89.75 | 2280.0 | 101.77 | 2585.0 | 101.77 | 2585.0 |
| Allowance for undercutting Left Dim | 0.59 | 15.0 | 0.59 | 15.0 | 0.59 | 15.0 |
| Allowance for undercutting Right Dim | 0.59 | 15.0 | 0.59 | 15.0 | 0.59 | 15.0 |
| Final backside opening | 90.94 | 2310.0 | 102.95 | 2615.0 | 102.95 | 2615.0 |
| Inward etching per side | 12.10 | 307.3 | 12.10 | 307.3 | 12.10 | 307.3 |
| (etch depth/tan(54.7) | | | | | | |
| Designed diaph. side length | 66.93 | 1700.0 | 78.74 | 2000.0 | 78.74 | 2000.0 |
| Final diaphram side length | 66.75 | 1695.5 | 78.76 | 2000.5 | 78.76 | 2000.5 |
| Error in alignment | | -2.3 | | 0.2 | | 0.2 |
| Pattern size | 130.00 | 3302.0 | 130.00 | 3302.0 | 140.00 | 3556.0 |
| saw kerf | 2.00 | 50.8 | 2.00 | 50.8 | 2.00 | 50.8 |
| final die size | 128.00 | 3251.2 | 128.00 | 3251.2 | 138.00 | 3505.2 |
| Seal width | 18.53 | 470.6 | 12.52 | 318.1 | 17.52 | 445.1 |

Fig. 7

| length (μm) [51] | thickness (μm) [52] | web thickness (μm) [53] | w1 [54] | w2 [55] | Topside mv/v" [56] | Topside BFSL 1psi [57] | Cavity side mv/v" [58] | Cavity side BFSL 1psi [59] | Sym [60] | Cavity side Span 5V Gain=20 0.25"H2O [61] | Cavity side Span 5V Gain=20 0.25"H2O [62] |
|---|---|---|---|---|---|---|---|---|---|---|---|
| 1700 | 13 | 5 | 100 | 400 | 1.987 | 0.005 | -1.988 | -0.004 | -0.076 | 49.67 | -49.71 |
| 1700 | 15 | 7 | 100 | 400 | 1.324 | 0.002 | -1.324 | -0.001 | -0.025 | 33.10 | -33.11 |
| 1700 | 15 | 8 | 100 | 400 | 1.167 | 0.001 | -1.167 | -0.001 | -0.012 | 29.18 | -29.19 |
| 1700 | 17 | 9 | 100 | 400 | 0.921 | 0.000 | -0.921 | 0.000 | -0.006 | 23.03 | -23.03 |

| length (μm) | thickness (μm) | web thickness (μm) | w1 | w2 | Topside mv/v" | Topside BFSL 1psi | Cavity side mv/v" | Cavity side BFSL 1psi | Sym | Cavity side Span 5V Gain=20 0.25"H2O | Cavity side Span 5V Gain=20 0.25"H2O |
|---|---|---|---|---|---|---|---|---|---|---|---|
| 2000 | 9 | 5 | 100 | 400 | 4.269 | 0.215 | -4.275 | 0.126 | -0.146 | 106.72 | -106.87 |
| 2000 | 11 | 5 | 100 | 400 | 3.673 | 0.107 | -3.698 | 0.029 | -0.824 | 91.82 | -92.45 |
| 2000 | 14 | 5 | 100 | 400 | 2.760 | 0.040 | -2.773 | -0.014 | -0.442 | 69.01 | -69.31 |
| 2000 | 18 | 5 | 100 | 400 | 1.887 | 0.013 | -1.890 | -0.008 | -0.177 | 47.16 | -47.25 |

To Fig. 7 (cont.)

| From Fig. 7 | | | | | | | | From Fig. 7 |
|---|---|---|---|---|---|---|---|---|
| 2000 | 22 | 5 | 100 | 400 | 1.342 | 0.005 | -1.343 | -0.004 | -0.077 | 33.56 | -33.58 |
| 2000 | 28 | 5 | 100 | 400 | 0.869 | 0.003 | -0.870 | -0.002 | -0.039 | 21.73 | -21.74 |
| 2000 | 11 | 7 | 100 | 400 | 2.480 | 0.015 | -2.474 | 0.044 | 0.242 | 61.99 | -61.84 |
| 2000 | 13 | 7 | 100 | 400 | 2.271 | 0.018 | -2.273 | 0.007 | -0.101 | 56.78 | -56.83 |
| 2000 | 15 | 7 | 100 | 400 | 2.008 | 0.015 | -2.011 | -0.055 | -0.161 | 50.21 | -50.29 |
| 2000 | 20 | 7 | 100 | 400 | 1.404 | 0.006 | -1.405 | -0.005 | -0.092 | 35.09 | -35.12 |
| 2000 | 26 | 7 | 100 | 400 | 0.928 | 0.002 | -0.928 | -0.002 | -0.033 | 23.20 | -23.20 |
| 2000 | 11 | 9 | 100 | 400 | 1.611 | -0.032 | -1.599 | 0.053 | 0.696 | 40.26 | -39.98 |
| 2000 | 14 | 9 | 100 | 400 | 1.552 | -0.003 | -1.550 | 0.010 | 0.107 | 38.80 | -38.75 |
| 2000 | 17 | 9 | 100 | 400 | 1.384 | 0.003 | -1.384 | 0.000 | -0.029 | 34.59 | -34.60 |
| 2000 | 20 | 9 | 100 | 400 | 1.185 | 0.003 | -1.185 | -0.002 | -0.047 | 29.62 | -29.63 |
| 2000 | 24 | 9 | 100 | 400 | 0.943 | 0.002 | -0.943 | -0.002 | -0.034 | 23.57 | -23.58 |
| 2000 | 26 | 9 | 100 | 400 | 0.841 | 0.002 | -0.841 | -0.001 | -0.026 | 21.02 | -21.02 |
| 2500 | 12 | 5 | 100 | 400 | 4.937 | 0.252 | -4.964 | 0.203 | -0.550 | 123.41 | -124.09 |
| 2500 | 15 | 5 | 100 | 400 | 3.883 | 0.084 | -3.903 | 0.023 | -0.525 | 97.06 | -97.57 |
| 2500 | 07 | 7 | 100 | 400 | 3.507 | 0.094 | -3.440 | 0.332 | 1.909 | 87.67 | -86.00 |
| 2500 | 12 | 7 | 100 | 400 | 3.431 | 0.072 | -3.418 | 0.127 | 0.428 | 85.82 | -85.45 |
| 2500 | 15 | 7 | 100 | 400 | 3.038 | 0.039 | -3.042 | 0.021 | -0.152 | 75.94 | -76.06 |
| 2500 | 18 | 7 | 100 | 400 | 2.549 | 0.020 | -2.554 | -0.002 | -0.182 | 63.73 | -63.84 |
| 2500 | 12 | 11 | 100 | 400 | 1.537 | -0.047 | -1.522 | 0.072 | 0.971 | 38.42 | -38.05 |
| 2500 | 15 | 11 | 100 | 400 | 1.589 | -0.014 | -1.584 | 0.026 | 0.320 | 39.73 | -39.60 |
| 2500 | 19 | 11 | 100 | 400 | 1.546 | -0.012 | -1.545 | 0.008 | 0.084 | 38.65 | -38.62 |

Fig. 7 (cont.)

PRESSURE SENSOR HAVING A BOSSED DIAPHRAGM

This application is a divisional of U.S. application Ser. No. 14/543,074, filed on Nov. 17, 2014, entitled "A Pressure Sensor with Bossed Diaphragm" to Stewart et al., which claims the benefit of Provisional Patent Application Ser. No. 61/924,347, filed Jan. 7, 2014, and entitled "Pressure Sensor with Bossed Diaphragm", both of which are hereby incorporated by reference in their entirety.

BACKGROUND

The present disclosure pertains to sensors and particularly to pressure sensors. More particularly, the disclosure pertains to pressure sensors having diaphragms.

SUMMARY

The disclosure reveals a pressure sensor having a diaphragm having a boss with a pattern. The diaphragm having a boss may be regarded as a bossed diaphragm. The bossed diaphragm may have higher sensitivity than a flat plate diaphragm having the same area as the bossed diaphragm. The bossed diaphragm may incorporate a simple cross pattern that can further improve the sensitivity and linearity of a pressure response of the diaphragm at low pressures. Reduction of sharp edges and corners of the boss and its legs around the periphery of the diaphragm may reduce high stress points and thus increase the burst pressure rating of the bossed diaphragm.

DESCRIPTION

The present system and approach may incorporate one or more processors, computers, controllers, user interfaces, wireless and/or wire connections, and/or the like, in an implementation described and/or shown herein.

This description may provide one or more illustrative and specific examples or ways of implementing the present system and approach. There may be numerous other examples or ways of implementing the system and approach.

A pressure transducer may be formed with a silicon substrate and an epitaxial (epi) layer, which is grown on the substrate. A portion of a backside of the substrate may be removed, leaving a thin, flexible diaphragm consisting of a portion of the epitaxial layer. Piezoresistors may be located in or on the diaphragm portion to measure deflection of the diaphragm to form a pressure transducer.

The transducer may be based on other kinds of materials such as gallium arsenide and so on. The transducer may be fabricated with various techniques such as micro-electro-mechanical systems (MEMS) and so on.

During operation, at least one surface of the diaphragm may be exposed to a pressure. The diaphragm may deflect according to a magnitude of the pressure on one side of the diaphragm that exceeds a pressure on an opposite surface of the diaphragm. A deflection of the diaphragm may create changes in a resistance value of the piezoresistors. A change in the resistance value of the piezoresistors may be reflected as a change in an output voltage signal of a resistive bridge formed at least partially by the piezoresistors. The resistance value may be converted to an indication of pressure exerted on one surface of the diaphragm.

A silicon substrate and an epitaxial layer may be formed from single crystal silicon. Flat plate diaphragms that are formed from single crystal silicon may produce acceptably high output signals with sufficient linearity corresponding to pressures ranging from five (5) inches $H_2O$ (0.18) to 6,000 psi (166,084 inches $H_2O$). However, the flat plate diaphragms formed from single crystal silicon do not necessarily produce acceptably high output signals with sufficient linearity corresponding to pressures below five (5) inches $H_2O$.

Diaphragm designs other than flat plate diaphragms may be used to build pressure sensors having acceptably high output signals with sufficient linearity corresponding to adequate sensitivity at low pressures, such as those below about five (5) inches of $H_2O$. For example, pressure sensors having bossed diaphragms may have higher sensitivity than that those having flat plate diaphragms with the same surface area. However, the bossed diaphragms may have lower burst pressures. In some cases, sharp edges formed among bosses and diaphragms when manufacturing the diaphragms and bosses may contribute to the lower burst pressure ratings.

To improve the sensitivity and linearity of a pressure sensor, diaphragms with bossed designs having intricate patterns may concentrate the stresses of sensed pressures at the piezoresistor sensors. However, intricate patterns may be difficult to manufacture, and in some cases, can contribute to a non-linear pressure response and orientation sensitivity, thus resulting in a higher total error band.

The present disclosure relates to pressure sensors having bossed diaphragms. In an illustrative example, a bossed diaphragm may also incorporate a simple cross pattern of legs that can be manufactured relatively easily and to improve the performance of the resultant sensor at low pressures. The bossed diaphragm with the cross pattern may provide 50 percent to 100 percent more sensitivity than a flat plate diaphragm for the same diaphragm area.

A low noise amplifier may be fabricated on the same sensor die as the pressure sensitive diaphragm. The low noise amplifier may be a differential in/differential out amplifier that is gain programmable, and have offset trimming. A combination of the bossed diaphragm with the cross pattern and the low noise amplifier on the same sensor die may provide higher sensitivity, more linear pressure response, and less little orientation sensitivity, than like characteristics of a pressure sensor having a bossed diaphragm without the cross pattern and the differential in/differential out amplifier that is gain programmable. Higher sensitivity, more linear pressure response, and less little orientation sensitivity may lower total error band.

The present pressure sensor may be manufactured using an integrated circuit manufacturing process that allows a bossed diaphragm and amplifier to be fabricated on the same sensor die. The bossed diaphragm may be fabricated such that sharp edges and/or corners that might otherwise be created on the boss and/or around the periphery of the diaphragm are reduced or removed. A reduction of sharp edges and/or corners created on the boss and/or around the periphery of the diaphragm may reduce high stress points in the device and thus increase the burst pressure rating of the sensor.

Figure 1:
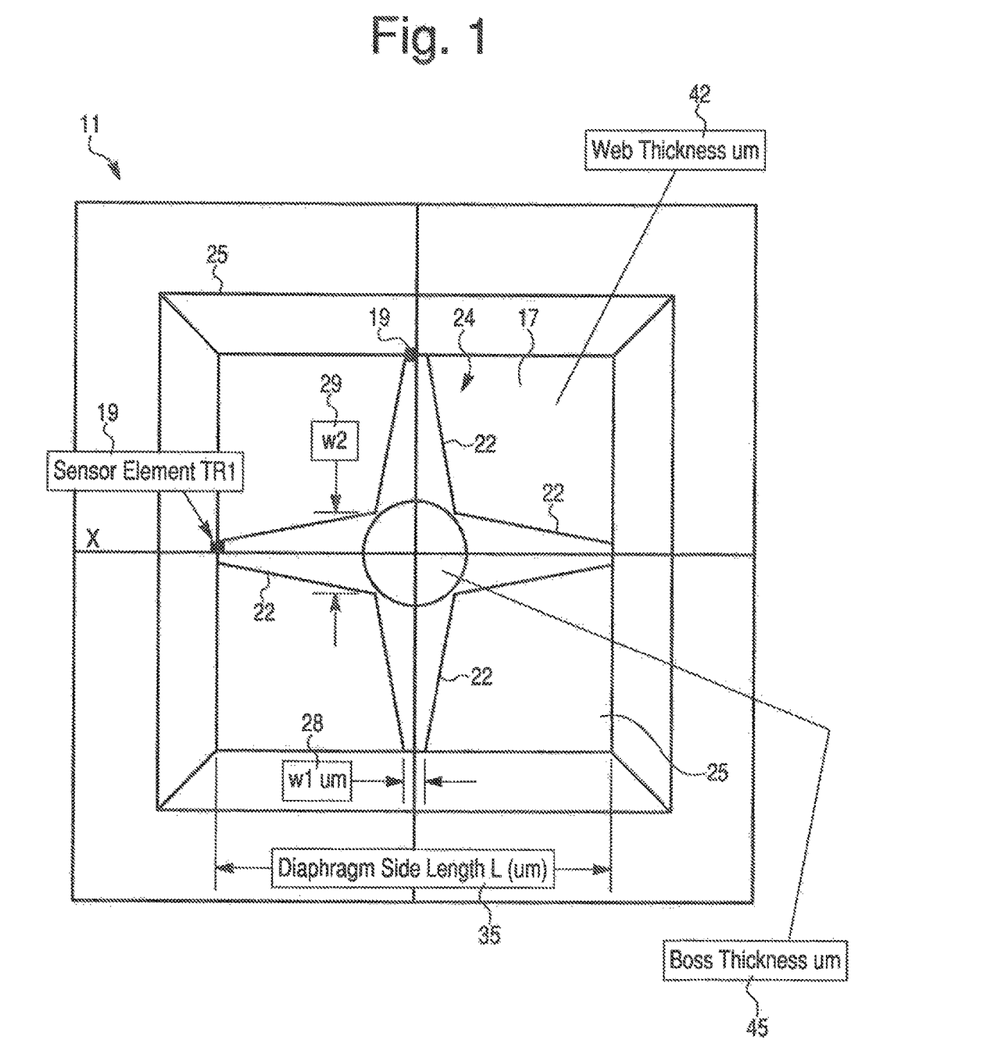
FIG. 1 is a diagram of a top view of a pressure sensor having an illustrative bossed diaphragm design.
Figure 2:
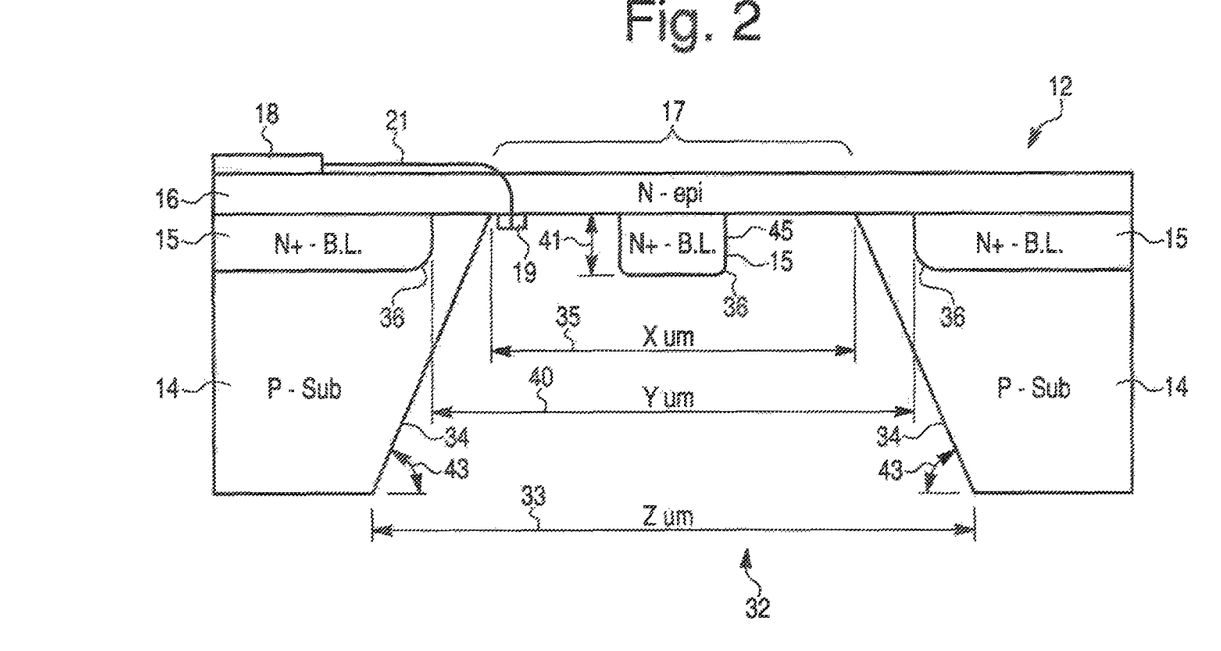
FIG. 2 is a diagram revealing one version of the illustrative bossed diaphragm shown in the diagram of FIG. 1.
Figure 3:
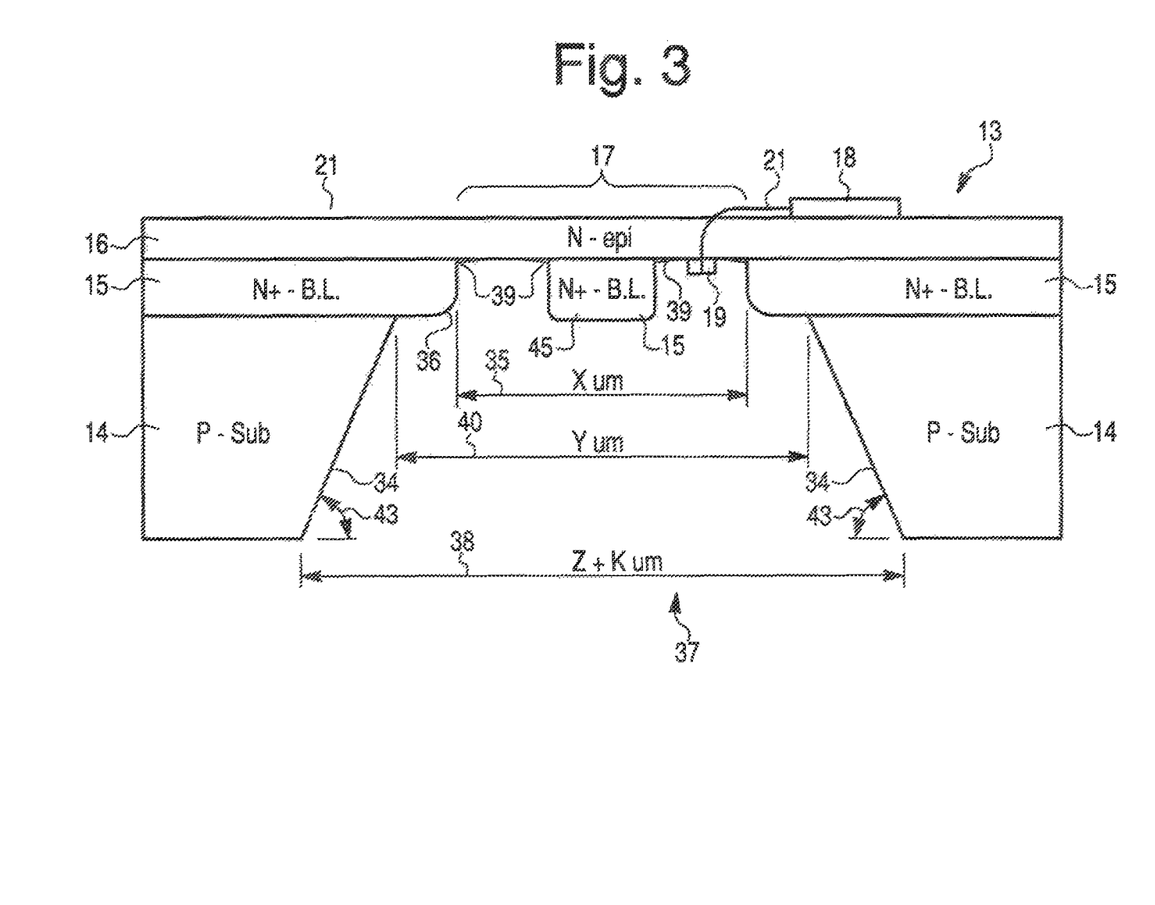
FIG. 3 is a diagram revealing another version of the illustrative bossed diaphragm shown in the diagram of FIG. 1.

FIG. 1 is a diagram of a top view of a pressure sensor 11 having an illustrative bossed diaphragm design. Illustrative cross-sections of pressure sensors 12 and 13 are shown in FIGS. 2 and 3, respectively. In the illustrative design, a p-silicon substrate 14 may be obtained. Using photolithography, a masking layer may be formed on top of silicon substrate 14, and then an implant may be provided, resulting in a patterned N+ buried layer 15. The masking layer may then be removed. The N+ buried layer 15 may define the boss 45 on a diaphragm 17. In some cases, and as noted herein, N+ buried layer 15 may also define the perimeter of diaphragm 17. In some cases, after the N+ implant, substrate 14 may be heated for a period of time to help diffuse the N+ implant into substrate 14, which may help round the edges and corners of the N+ buried layer, as shown in FIGS. 2-3.

Next, an N− silicon epitaxial (epi) layer 16 may be grown on the top surface of the substrate/buried layer 15. The epi layer 16 may form a diaphragm 17 of the pressure sensor 11. The thickness of the epi layer 16 may be controlled.

Circuitry 18 may be added to system 12 in different ways in a remote or integrated fashion. FIG. 1 is just one possible approach among others. For instance, circuitry 18 may be formed on or in the epi layer 16. For example, in some cases, circuitry 18 may be formed in the epi layer laterally adjacent to diaphragm 17. Forming circuitry 18 may be accomplished using integrated circuit processing techniques. In one example, circuitry 18 may incorporate a low noise amplifier 23 that is formed in the epi layer 16 laterally adjacent to the diaphragm 17. The low noise amplifier 23 may be a differential in/differential out amplifier that is gain programmable, and may have offset trimming (e.g., laser trimming). A combination of diaphragm 17 and amplifier 23 of circuitry 18 on the same silicon die may provide high sensitivity, high linear pressure response, and very little orientation sensitivity, which can result in a low total error band, relative to other diaphragm and circuit designs. Sensor elements, such as piezoresistors 19, may be provided on diaphragm 17 and may be connected to the low noise amplifier with an interconnect 21. When provided, piezoresistors 19 may be formed using a photolithographic process, and as such, the placement and size of piezoresistors 19 may be controlled. In some cases, it appears beneficial to control the placement of piezoresistors 19 relative to diaphragm 17. That is, and in some instances such as shown in FIG. 1, piezoresistors 19 may be placed near an edge of diaphragm 17 and centered with respect to a boss leg 22. In some cases, the size of piezoresistors 19 may dictate a minimum dimension for w1 of the corresponding boss leg 22. W2 may be a maximum dimension of a boss leg 22.

While a low noise amplifier 23 may be used here as an example circuit that may be formed in or on epi layer 16, other circuitry 18 and/or devices may be formed including, but not limited to, compensation circuitry, analog to digital (A/D) conversion circuitry, signal processing circuitry, other sensors such as temperature, humidity and/or flow sensors, and/or any other suitable circuitry and/or devices as desired.

In some cases, diaphragm 17 may be square in shape as shown in FIG. 1. However, diaphragm 17 may be round in shape, or may have any other suitable shape as desired. Boss 45 may take on any suitable configuration and shape. In the example shown in FIG. 1, boss 45 may incorporate a simple cross pattern 24, which is not necessarily highly intricate and can be easily manufactured. The shape and dimensions of boss 45 (and in some cases diaphragm 17) may be controlled using a photolithographic process, as described herein with respect to FIGS. 2-4. In some cases, the boss cross pattern 24 may have four legs 22, each with a width "w1" 28 at or near a perimeter 25 of diaphragm 17 and a width "w2" 29 at or near a central region of boss 45. Diaphragm 17 (e.g., part of epi layer 16) may have a web thickness 26, and boss 45 may have a boss thickness 27. In the example shown in FIG. 1, diaphragm 17 may have a side length 31 of "L". The piezoresistors 19 may be placed near the edge or perimeter of diaphragm 17, sometimes centered with respect to a boss leg 22. In some cases, the size of piezoresistors 19 may define a minimum dimension for "w1" 28.

With buried layer 15 and epi layer 16 formed, the back side of silicon substrate 14 may be etched. In one example, an etch opening 32 in FIG. 2 may be made. A mask layer may be provided that defines etch opening 32 along the back side of silicon substrate 14 having a dimension "z" 33. The back side of silicon substrate 14 may then be exposed to an etch, such as a KOH etch, through etch opening 32. The etch may etch p-silicon substrate 14 as shown in FIG. 2. When silicon substrate 14 is a single crystal silicon, etch side walls 34 may be at an angle 43 as shown, following the crystalline plane of silicon substrate 14. N-epi layer 16 and N+ buried layer 15 may act as an etch stop. A side length 35 of the diaphragm may be defined by a dimension "x", which can be dependent upon the size 33 and an angle 43 of the side walls 34 of the initial etch opening "z" 32. A distance between buried layers 15 at perimeter 15 may be indicated by dimension "y". Boss 45 in the center, which is formed by patterned N+ buried layer 15, may now be exposed and have rounded edges 36 and corners 36. Rounded edges 36 and corners 36 may result from the N+ implantation (and sometimes subsequent heat diffusion) of N+ buried layer 16. Rounded edges 36 and corners 36 may substantially increase the burst pressure of diaphragm 17 by reducing sharp edges of boss 45.

In another example, an etch process may be illustrated in FIG. 3. A mask layer may be provided that defines an etch opening 37 along the back side of substrate 14 having a dimension 38 ("z+k"). The back side of silicon substrate 14 may then be exposed to an etch, such as a KOH etch, through etch opening 37. The etch may etch opening 37 in p-silicon substrate 14. N− epi layer 16 and N+ buried layer 15 may act as an etch stop. The side length of the diaphragm may now defined by dimension 35 ("x"), which in FIG. 3, can defined by the distance between lateral buried layer 15 regions. Dimension 35 may be controlled by the photolithographic process used to implant buried layer 15. Also, the dimensions of boss 41 may be controlled by the photolithographic process used to implant buried layer 15.

As noted herein, boss 45 of buried layer 15 may have rounded edges and corners, which may substantially increase the burst pressure of diaphragm 17. In FIG. 3 the edges around perimeter 25 of diaphragm 17 may have rounded edges 39 and corners 39. This may further increase the burst pressure of diaphragm 17. A bossed diaphragm 17 etched using the etch process with a result illustrated in FIG.

3 may have a significantly higher burst pressure than a bossed diaphragm 17 etched using the etch process with a result illustrated in FIG. 2. The increase burst pressure may be, because of rounded edges 39 and corners 39 around perimeter 25 of diaphragm 17 that are formed by the etch process on the example shown in FIG. 3 but not necessarily formed by the etch process used for the example in FIG. 2.

Figure 4:
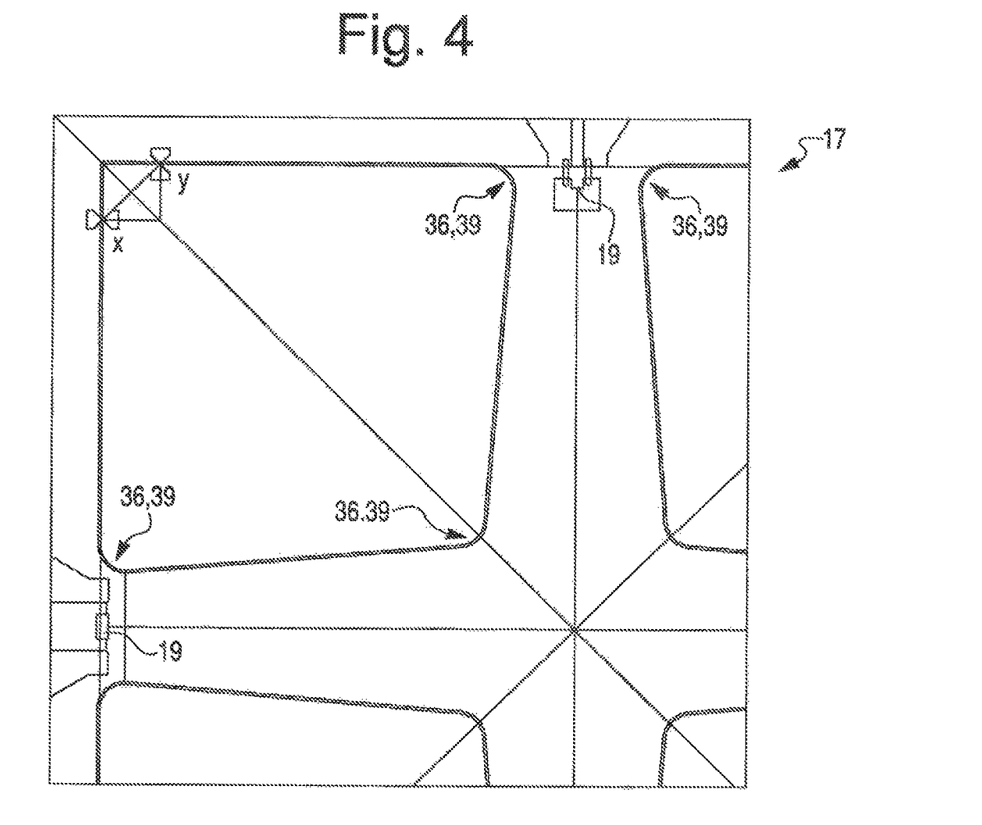
FIG. 4 is a diagram of a schematic top view of an upper left part of the bossed diaphragm shown in the diagram of FIG. 1.

Rounded edges 36, 39 and corners 36, 39 may not necessarily just exist in the z-axis relative to the plane of the silicon substrate (as shown in the diagrams of FIGS. 2-3), but may also exist in the x-y axes relative to diaphragm 17 shown in the diagram of FIG. 4. In general, rounded edges 36, 39 and corners 36, 39 may further increase the burst pressure of the diaphragm 17.

Figure 5:
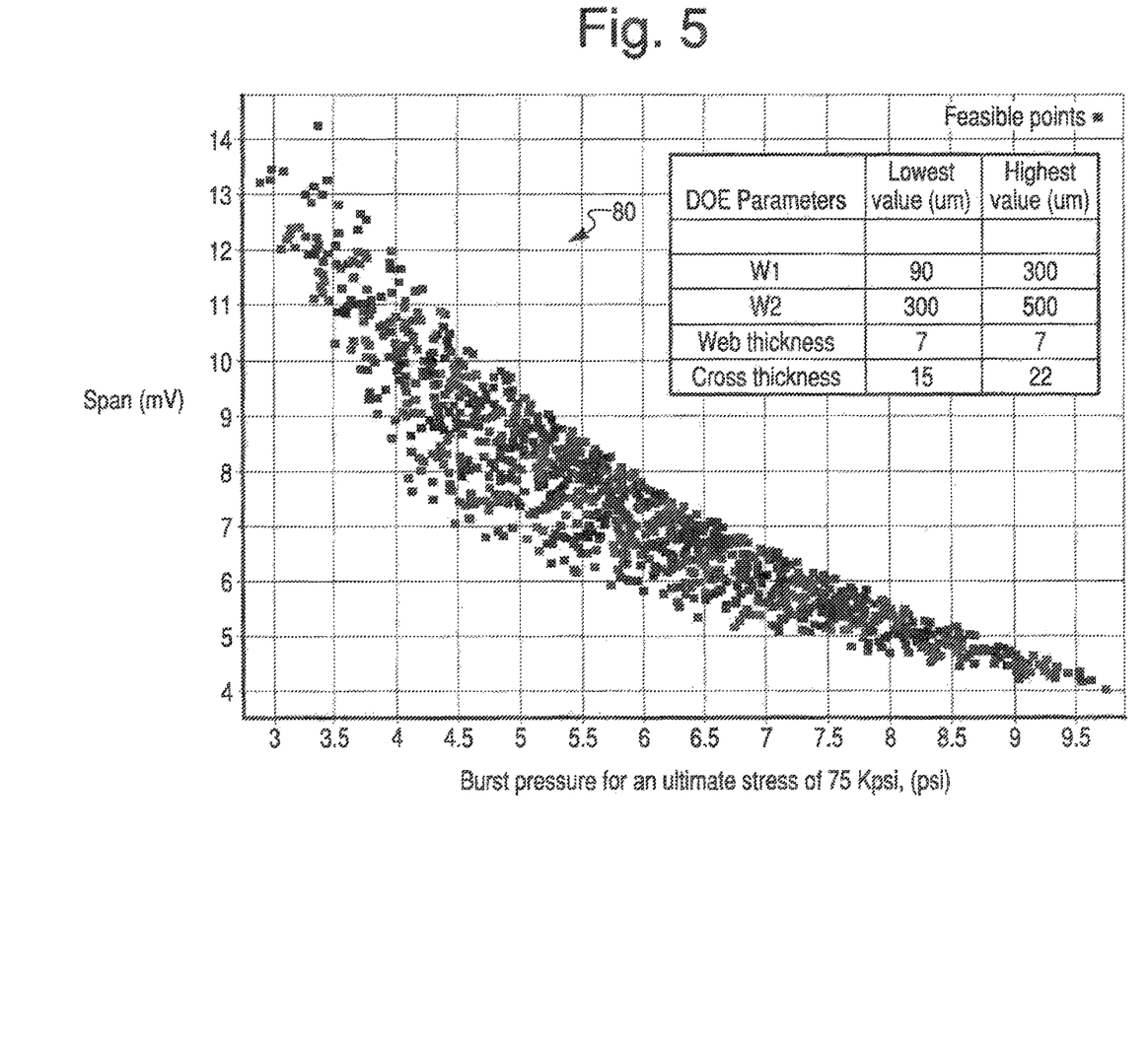
FIG. 5 is a diagram of a chart showing the span of burst pressure for an ultimate stress.

FIG. 5 is diagram of a chart 80 showing an estimated span (my) at full pressure scale versus burst pressure (psi) in view of an assumption that diaphragm 17 will burst at an edge stress of 75 thousand pounds per square inch (Kpsi) (517.1 Mpa). The chart may reveal a modeled design space where dimension 28 (w1) is allowed to range from 90-300 microns (3.54-11.81 mils) and dimension 29 (w2) is allowed to range from 300-500 microns (11.8149.69 mils). It has been found that an appropriate ratio dimension 28/dimension 29 (w2/w1) may be in the range of 1.1-2.0, 1.2-1.8, 1.3-1.5 or any other suitable range. The ratio may be optimized for a particular optimum performance. A bossed diaphragm 17 with a higher ratio may be expected to have a higher span and lower burst pressure, and the boss diaphragm 17 with a lower ratio may be expected to have a lower span and higher burst pressure. The data does not necessarily model a bossed diaphragm that was etched using the etch process illustrated in the example in the diagram of FIG. 3. As a comparative example, the etch illustrated by the diagram of FIG. 3 may significantly increase the burst pressure of the diaphragm relative to the etch illustrated by the diagram of FIG. 2.

Figure 6:
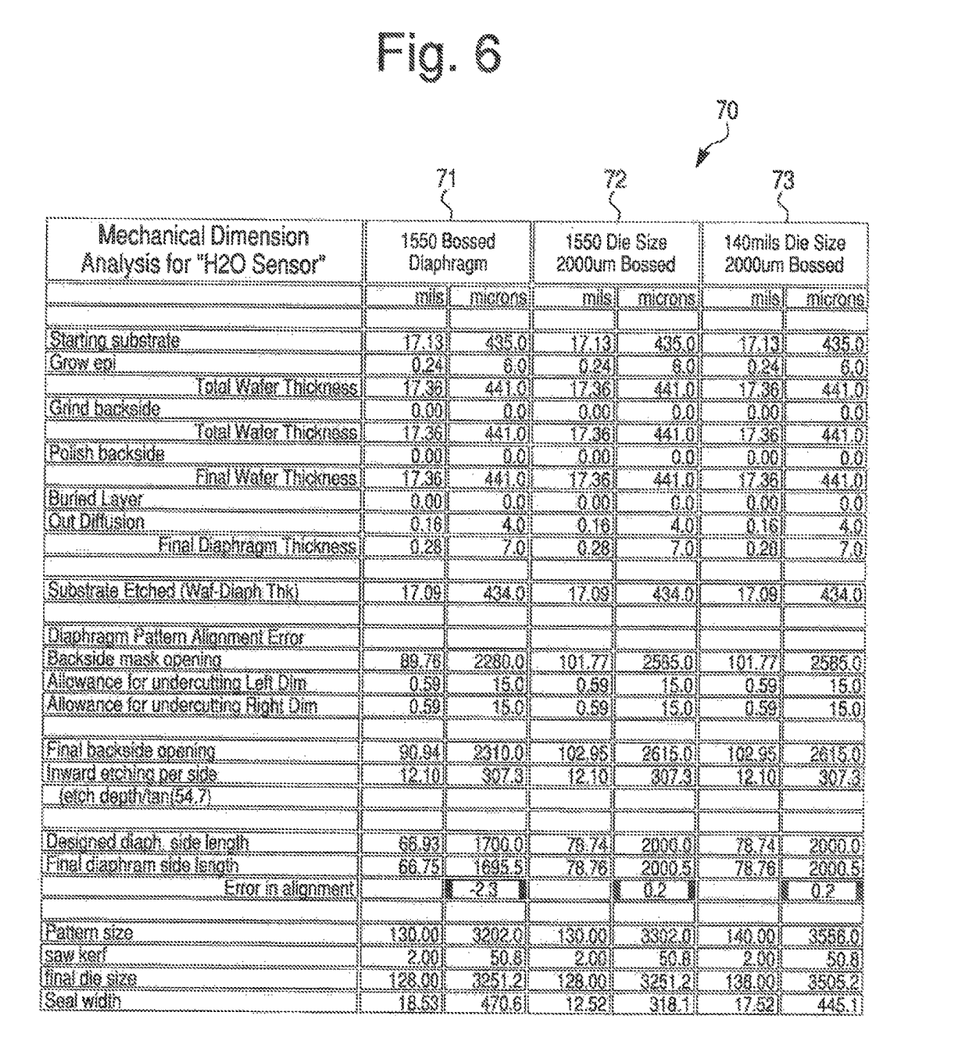
FIG. 6 is a diagram of a table showing various dimensions of a number of different configurations of the illustrative bossed diaphragm design of FIG. 1.

FIG. 6 is a diagram of a table 70 revealing a mechanical dimension analysis for an "H$_2$O" sensor showing three sets of dimensions (in mils and microns) relating to materials and steps of a process of fabrication for designs 71, 72 and 73, respectively, based on the bossed diaphragm shown in FIG. 1. Thicknesses may be given for starting substrate, grow epi, grind backside, polish backside, buried layer, out diffusion, and wafer diaphragm thickness. Dimensions of diaphragm pattern alignment error may be given for backside mask opening, allowance for undercutting the left dimension, allowance for undercutting the right dimension final backside opening, inward etch per side, designed diaphragm side length, final diaphragm side length, and error in alignment. Dimensions may be given for pattern size, saw kerf, final die size and seal width.

Figure 7:
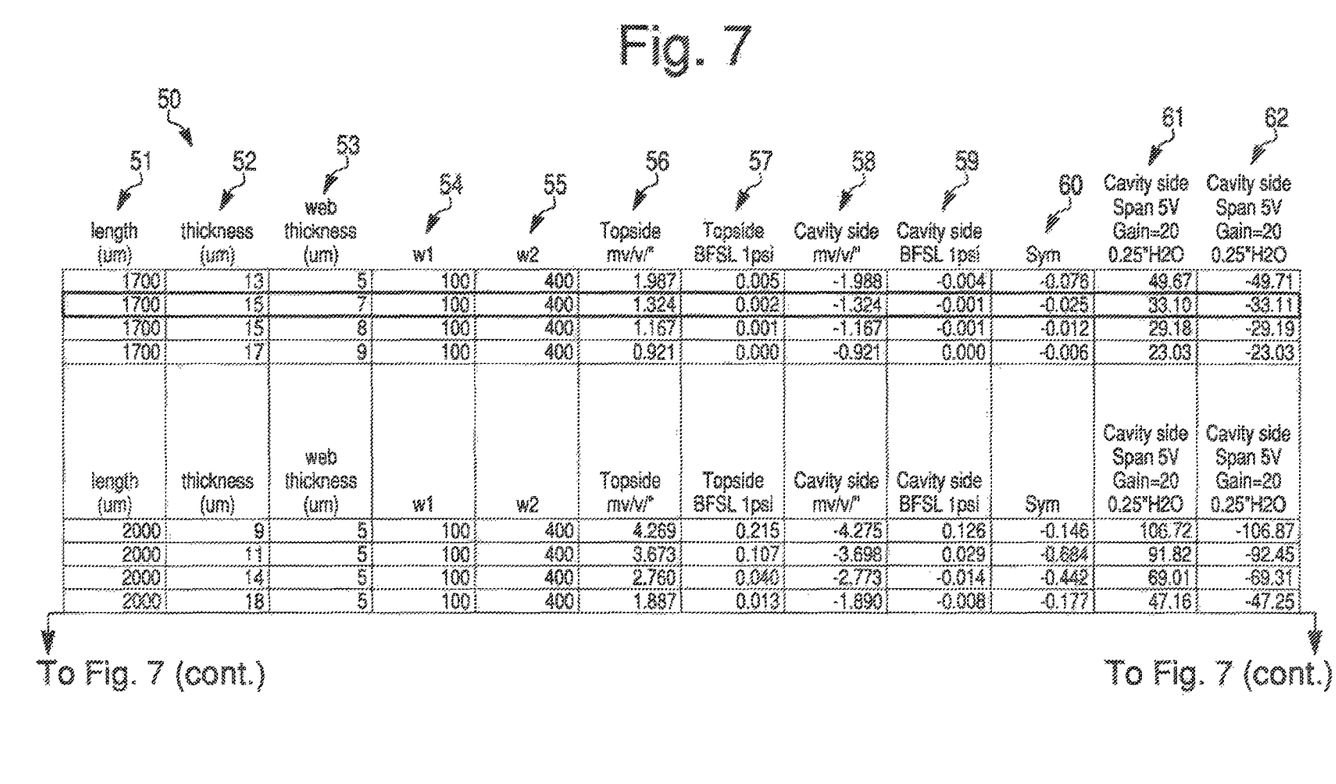
FIG. 7 is a diagram of a table showing various estimated parameters for each of a number of different configurations of the illustrative bossed diaphragm design of FIG. 1.

FIG. 7 is a diagram of a table 50 showing various estimated parameters for each of a number of different configurations of the illustrative bossed diaphragm 17 shown in the diagram of FIG. 1. A first column 51 represents the diaphragm length "L" 35, a second column 52 represents the boss thickness 41, a third column 53 represents epi layer 16 thickness 42 (web thickness) in the area of diaphragm 17, and w1 of a column 54 and w2 of a column 55 represent dimensions 28 and 29, respectively, of boss legs 22. Various estimated performance parameters for each configuration may be shown in columns 56-62. Column 56 represents topside mv/v/"; column 57 represents topside BFSL 0.25" H2O; column 58 represents cavity side mv/v/"; column 59 represents cavity side BFSL 0.25" H$_2$O; column 60 represents symmetry; column 61 represents topside span for 5V and gain=20 at 0.25" H$_2$O; and column 62 represents cavity side span for 5V and gain=20 at 0.25" H$_2$O.

To recap, a pressure sensor system may incorporate a silicon substrate; a buried layer implanted in a first side of the substrate, the buried layer having a pattern that defines a boss and a perimeter for a diaphragm; and a silicon epitaxial layer situated on the first side of the substrate.

A second side of the substrate may have an opening that extends to the buried layer and a portion of a back side of the epitaxial layer exposed by openings in the buried layer as defined by the pattern of the buried layer. The openings in the buried layer may reveal a diaphragm having the perimeter defined by the pattern of the buried layer, and reveal a boss defined by the pattern of buried layer, the boss being attached to the diaphragm that consists of a portion of the epitaxial layer.

The system may further incorporate one or more sensors situated to detect deflection of the diaphragm.

The pattern of the buried layer may define one or more legs connecting the boss to the e perimeter of the diaphragm.

The one or more sensors may be situated near or on the one or more legs, respectively.

The one or more legs may have a minimum width near or at the perimeter of the diaphragm and a maximum width near or at the boss.

The one or more sensors may be piezoresistive sensors situated near or at the minimum width of the one or more legs, respectively.

The one or more legs may have a first width near or at the perimeter of the diaphragm and a second width near or at the boss. A ratio of the second width to the first width may be optimized for achieving optimum performance of the one or more sensors in terms of strength and accuracy of a signal representing a measured pressure at a selected pressure range for detection.

The one or more legs may be situated in a cross-pattern as positioned between the boss and the perimeter of the diaphragm.

The system may further incorporate electronics situated in the epitaxial layer laterally adjacent to the diaphragm, and connected to the one or more sensors. One or more items of the electronics may be selected from a group consisting of a differential in/differential out amplifier, compensation circuitry, gain circuitry, digital conversion circuitry for analog signals, analog conversion circuitry for digital signals, signal processing circuitry, temperature sensors, humidity sensors, and flow sensors.

Edges and corners of the boss that meet the diaphragm, edges and corners of the one or more legs that meet the diaphragm and the boss, edges and corners of the buried layer that meet the diaphragm and the epitaxial layer, or external corners of the boss, legs and buried layer may be rounded or smoothed.

An approach for making a pressure sensor system may incorporate implanting a patterned buried layer, based on a masking, at a front side of a silicon substrate; heating the substrate to diffuse the buried layer in the substrate to round or smooth edges and corners of the buried layer; forming a silicon epitaxial layer having a back side on the front side of the substrate and on a front side of the buried layer; and creating an opening, as defined by masking, into a back side of the substrate up to a back side of the epitaxial layer and a back side of the one or portions of the buried layer.

The patterned buried layer may reveal in the opening a diaphragm consisting of a portion of the silicon epitaxial layer having a perimeter formed by one or more portions of the buried layer on the epitaxial layer and having a boss formed by a portion of the buried layer, the boss being situated on the diaphragm.

The patterned buried layer may further reveal in the opening, one or more legs on the epitaxial layer connecting the boss to the one or more portions of the buried layer at the perimeter of the diaphragm.

The approach may further incorporate forming one or more piezoresistive sensors on the diaphragm.

The approach may further incorporate forming electronics in the epitaxial layer laterally adjacent to the diaphragm and connected to the one or more piezoresistive sensors, the electronics obtaining and amplifying signals from the one or more piezoresistive sensors indicating magnitudes of deflection of the diaphragm, that represent pressures affecting the diaphragm.

A pressure detection mechanism may incorporate a substrate; a buried layer implanted in a first side of the substrate, the buried layer having a pattern that defines a boss and a perimeter for a diaphragm; and an epitaxial layer situated on the first side of the substrate.

A second side of the substrate may have an opening that extends to the buried layer and a portion of a back side of the epitaxial layer exposed by openings in the buried layer as defined by the pattern of the buried layer. The openings in the buried layer may reveal a diaphragm having the perimeter defined by the pattern of the buried layer, and reveal a boss defined by the pattern of buried layer, the boss being attached to the diaphragm that consists of a portion of the epitaxial layer.

The pressure detection mechanism may further incorporate one or more diaphragm deflection sensors.

The pattern of the buried layer may define one or more legs connecting the boss to the perimeter of the diaphragm. The one or more diaphragm deflection sensors may be situated at or on the one or more legs.

The one or more legs may have a first width dimension near or at the perimeter of the diaphragm and a maximum width dimension near or at the boss. A ratio of the second width to the first width may be optimized for achieving optimum performance of the one or more diaphragm deflection sensors in terms of signal strength and accuracy of a measured pressure.

The one or more legs may be situated in a cross-pattern as positioned between the boss and the perimeter of the diaphragm.

Edges and corners of the boss that meet the diaphragm, edges and corners of the one or more legs that meet the diaphragm and the boss, edges and corners of the buried layer that meet the diaphragm and the epitaxial layer, or external corners of the boss, legs and buried layer may be rounded or smoothed.

Pertinent references may incorporate U.S. Pat. No. 6,528,340, issued Mar. 4, 2003; U.S. Pat. No. 6,796,193, issued Sep. 28, 2004; U.S. Pat. No. 7,493,823, issued Feb. 24, 2009; and U.S. Patent Application Publication No. 2012/0125114, published May 24, 2012; all of which are hereby incorporated by reference.

In the present specification, some of the matter may be of a hypothetical or prophetic nature although stated in another manner or tense.

Although the present system and/or approach has been described with respect to at least one illustrative example, many variations and modifications will become apparent to those skilled in the art upon reading the specification. It is therefore the intention that the appended claims be interpreted as broadly as possible in view of the related art to include, all such variations and modifications.

What is claimed is:

1. A method comprising:
   forming a mask on a front side of a substrate, wherein the mask defines a masked area and an unmasked area;
   implanting a buried layer corresponding to the unmasked area on the front side of the substrate;
   forming an epitaxial layer on the front side of the substrate and on a front side of the buried layer, wherein the epitaxial layer has a back side; and
   creating an opening into a back side of the substrate up to a back side of the epitaxial layer and a back side of the one or portions of the buried layer, wherein creating the opening forms a diaphragm that includes a portion of the silicon epitaxial layer and has a perimeter defined by one or more portions of the buried layer, and the diaphragm carries a boss formed by a portion of the buried layer.

2. A method comprising:
   forming a mask on a front side of a substrate, wherein the mask defines a masked area and an unmasked area;
   implanting a buried layer corresponding to the unmasked area on the front side of the substrate;
   forming an epitaxial layer on the front side of the substrate and on a front side of the buried layer, wherein the epitaxial layer has a back side;
   creating an opening into a back side of the substrate up to a back side of the epitaxial layer and a back side of the one or portions of the buried layer; and
   heating the substrate to diffuse the buried layer in the substrate, wherein edges and corners of the buried layer are rounded or smoothed in response to the heating.

3. The method of claim 1, wherein creating the opening further forms one or more legs on the epitaxial layer connecting the boss to the one or more portions of the buried layer at the perimeter of the diaphragm.

4. The method of claim 3, wherein the one or more legs have a minimum width near or at the perimeter of the diaphragm and a maximum width near or at the boss.

5. The method of claim 4, wherein a ratio of the maximum width to the minimum width is between about 1.1 to about 2.

6. The method of claim 3, further comprising:
   forming one or more piezoresistive sensors on the front side of the epitaxial layer.

7. The method of claim 6, wherein the one or more piezoresistive sensor are formed over or near the one or more legs.

8. The method of claim 7, further comprising:
   forming electronics in the epitaxial layer laterally adjacent to the diaphragm and connected to the one or more piezoresistive sensors.

9. The method of claim 1, wherein the substrate comprises a silicon substrate.

10. The method of claim 1, wherein the epitaxial layer comprises silicon.

11. The method of claim 1, wherein creating the opening comprises etching the back side of the substrate up to the back side of the epitaxial layer and the back side of the buried layer.

12. A method for making a pressure sensor system comprising:
   implanting a patterned buried layer, based on a masking, at a front side of a silicon substrate;
   heating the substrate to diffuse the buried layer in the substrate to round or smooth edges and corners of the buried layer;

forming a silicon epitaxial layer having a back side on the front side of the silicon substrate and on a front side of the buried layer; and creating an opening, as defined by masking, into a back side of the substrate up to a back side of the epitaxial layer and a back side of the one or portions of the buried layer.

13. The method of claim 12, wherein the patterned buried layer reveals in the opening a diaphragm consisting of a portion of the silicon epitaxial layer having a perimeter formed by one or more portions of the buried layer on the epitaxial layer and having a boss formed by a portion of the buried layer, the boss being situated on the diaphragm.

14. The method of claim 13, wherein the patterned buried layer further reveals in the opening, one or more legs on the epitaxial layer connecting the boss to the one or more portions of the buried layer at the perimeter of the diaphragm.

15. The method of claim 14, wherein the one or more legs have a minimum width near or at the perimeter of the diaphragm and a maximum width near or at the boss.

16. The method of claim 14, further comprising:
forming one or more piezoresistive sensors on the diaphragm.

17. The method of claim 16, further comprising:
forming one or more piezoresistive sensors on the diaphragm, wherein the one or more sensors are situated near or on the one or more legs.

18. The method of claim 16, further comprising:
forming electronics in the epitaxial layer laterally adjacent to the diaphragm and connected to the one or more piezoresistive sensors.

19. The method of claim 16, further comprising:
obtaining and amplifying, by the electronics, signals from the one or more piezoresistive sensors indicating magnitudes of deflection of the diaphragm that represent pressures affecting the diaphragm.

* * * * *